(12) United States Patent
Chen et al.

(10) Patent No.: US 7,848,068 B2
(45) Date of Patent: Dec. 7, 2010

(54) ESD PROTECTION CIRCUIT USING SELF-BIASED CURRENT TRIGGER TECHNIQUE AND PUMPING SOURCE MECHANISM

(75) Inventors: Shih-Hung Chen, Sindian (TW); Ming-Dou Ker, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 847 days.

(21) Appl. No.: 11/740,904

(22) Filed: Apr. 26, 2007

(65) Prior Publication Data

US 2008/0062598 A1 Mar. 13, 2008

Related U.S. Application Data

(60) Provisional application No. 60/824,795, filed on Sep. 7, 2006.

(51) Int. Cl.
*H02H 9/00* (2006.01)
(52) U.S. Cl. ......................................................... 361/56
(58) Field of Classification Search .................... 361/56
See application file for complete search history.

(56) References Cited

U.S. PATENT DOCUMENTS

| | | | | |
|---|---|---|---|---|
| 6,462,601 | B1 * | 10/2002 | Chang et al. ................. | 327/313 |
| 6,650,165 | B1 * | 11/2003 | Mallikarjunaswamy ..... | 327/310 |
| 7,110,228 | B2 * | 9/2006 | Chang .......................... | 361/56 |
| 7,233,467 | B2 * | 6/2007 | Mergens et al. .............. | 361/56 |
| 2004/0169541 | A1 * | 9/2004 | Hirata .......................... | 327/333 |
| 2005/0083623 | A1 * | 4/2005 | Yeh et al. ...................... | 361/56 |
| 2006/0262472 | A1 * | 11/2006 | Okushima ................... | 361/91.1 |
| 2007/0182444 | A1 * | 8/2007 | Tanaka et al. ................. | 326/21 |
| 2007/0223163 | A1 * | 9/2007 | Hung et al. ................. | 361/93.1 |
| 2008/0062597 | A1 * | 3/2008 | Chen et al. ..................... | 361/56 |

FOREIGN PATENT DOCUMENTS

CN 1399386 A 2/2003

OTHER PUBLICATIONS

*ESD Association Standard for the Development of an Electrostatic Discharge Control Program for Protection of Electrical and Electronic Parts, Assemblies and Equipment (Excluding Electrically Initiated Explosive Device)*, ANSI/ESD-S20.20/1999 (Aug. 4, 1999), pp. 1-11.

Mergens et al., *Active-Source-Pump (ASP) Technique for ESD Design Window Expansion and Ultra-thin Gate Oxide Protection in Sub-90nm Technologies*, Proc. of IEEE CICC, 2004, pp. 251-254.

Office Action for Chinese Application No. 2007101492215 dated Apr. 24, 2009.

* cited by examiner

*Primary Examiner*—Ronald W Leja
(74) *Attorney, Agent, or Firm*—Alston & Bird LLP

(57) ABSTRACT

A circuit capable of providing electrostatic discharge (ESD) protection includes a first transistor including a first gate and a first source, the first gate being connected to a conductive pad, an impedance device between the first source and a first power rail capable of providing a resistor, a second transistor including a second gate and a second source, the second source being connected to the first power rail through the impedance device, and a clamp device between the first power rail and a second power rail, wherein the clamp device is capable of conducting a first portion of an ESD current and the second transistor is capable of conducting a second portion of the ESD current as the conductive pad is relatively grounded.

31 Claims, 18 Drawing Sheets

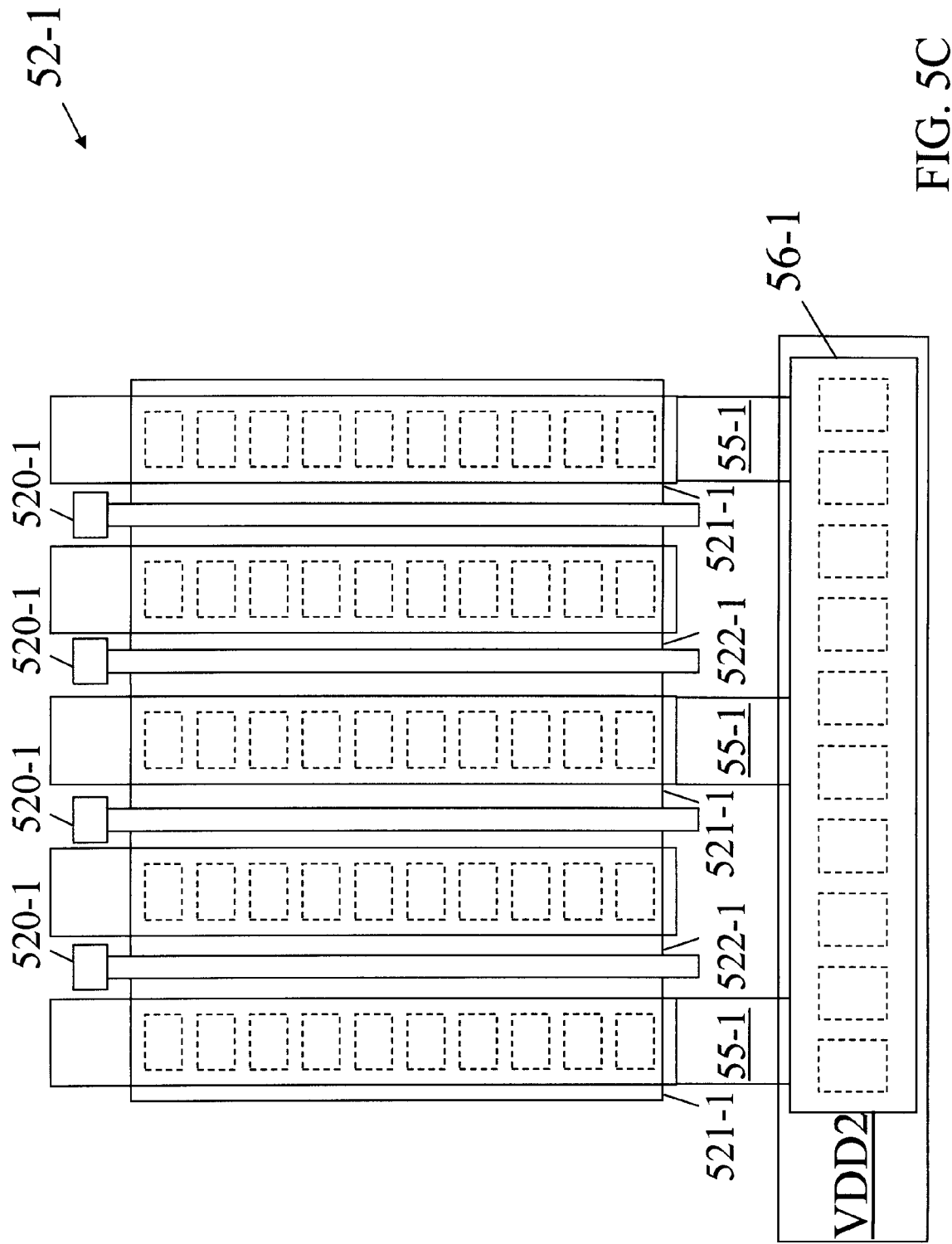

ESD PROTECTION CIRCUIT USING SELF-BIASED CURRENT TRIGGER TECHNIQUE AND PUMPING SOURCE MECHANISM

CROSS-REFERENCE TO RELATED APPLICATIONS

This application claims the benefit of U.S. Provisional Application No. 60/824,795, filed Sep. 7, 2006.

BACKGROUND OF THE INVENTION

The present invention relates generally to circuits for electrostatic discharge ("ESD") protection.

A semiconductor integrated circuit ("IC") is generally susceptible to an electrostatic discharge ("ESD") event, which may damage or destroy the IC. An ESD event refers to a phenomenon of electrical discharge of a current (positive or negative) for a short duration during which a large amount of current is provided to the IC. The susceptibility of a device to ESD can be determined by testing for one of three models: Human Body Model ("HBM"), Machines Model ("MM"), and Charged-Device Model ("CDM").

The ESD *Association Standard for the Development of an Electrostatic Discharge Control Program for Protection of Electrical and Electronic Parts, Assemblies and Equipment (Excluding Electrically Initiated Explosive Device)*, ANSI/ESD-S20.20-1999 (Aug. 4, 1999), provides for ESD sensitivity testings for each of the three models. The HBM model represents the discharge from the fingertip of a standing individual delivered to conductive leads of a device. In an HBM model ESD test circuit modeled by a 100 picofarad (pF) capacitor, representing the effective capacitance of the human body, a discharge through a switching component and 1,500 ohm series resistor, representing the effective resistance of the human body, into the device under tests is a double exponential waveform with a rise time of 2-10 nanoseconds (nS) and a pulse duration of approximately 150 nS.

The MM model represents a rapid discharge from items such as a charged board assembly, charged cables, or the conduction arm of an automatic tester. The effective capacitance is approximately 200 pF discharged through a 500 nanohenry (nH) inductor directly into the device because the effective resistance of the machine is approximately zero. The discharge is a sinusoidal decaying waveform having a peak current of approximately 3.8 amperes (A) with a resonant frequency of approximately 16 MHz.

The CDM model represents a phenomenon where a device acquires a charge through frictional or electrostatic induction processes and then abruptly touches a grounded object or surface. FIG. 1 is a schematic diagram illustrating the CDM phenomenon. Referring to FIG. 1, most of the charge is accumulated in a substrate, including a base, a bulk or a well of the device, and is uniformly distributed in the substrate. Unlike the HBM model and the MM model, the CDM model includes situations where the device itself becomes charged and discharges to ground. The rise time is generally less than 200 picoseconds (pS), and the entire ESD event can take place in less than 2 nS. Current levels can reach several tens of amperes during discharge, which are remarkably greater than those of the HBM and MM models.

Since the charge is mainly stored in the substrate, a gate oxide of an input-stage metal-oxide-semiconductor ("MOS") transistor may be easily damaged by a CDM ESD. FIG. 2 is a schematic circuit diagram of a conventional ESD protection circuit for an input-stage inverter. Referring to FIG. 2, the ESD protection circuit comprises an ESD clamp and an n-type metal-oxide-semiconductor ("NMOS") transistor Mn1, and the input-stage inverter comprises a p-type metal-oxide-semiconductor ("PMOS") transistor Mp5 and an NMOS transistor Mn5. The ESD protection circuit designed for HBM and MM ESD protection, however, may not provide effective CDM ESD protection for the input-stage inverter. When a CDM ESD occurs as an input pad is grounded, a CDM ESD current $I_{ESD}$ due to negative charge may damage the gate oxide of the NMOS transistor Mn5. Likewise, a CDM ESD current due to positive charge stored in the substrate may also damage the gate oxide of the NMOS transistor Mn5.

Verious Studies have addressed protecting an IC from ESD events. In a paper entitled "Active-source-pump (ASP) technique for ESD design window expansion and ultra-thin gate oxide protection in sub-90 nm Technologies" by Mergens et al., *Proc. of IEEE CICC*, 2004, pp. 251-254, it has been found that gate-to-source breakdown voltages are much lower than gate-to-bulk breakdown voltages. Consequently, pumping schemes to reduce a gate-to-source voltage so as to prevent the gate oxide from CDM ESD damage have been proposed to enhance the ESD robustness in nanoscale complementary metal-oxide-semiconductor ("CMOS") techniques.

BRIEF SUMMARY OF THE INVENTION

The present invention is directed to circuits capable of ESD protection. Examples of the present invention may provide a circuit capable of providing electrostatic discharge (ESD) protection that comprises a first transistor including a first gate and a first source, the first gate being connected to a conductive pad, an impedance device between the first source and a first power rail capable of providing a resistor, a second transistor including a second gate and a second source, the second source being connected to the first power rail through the impedance device, and a clamp device between the first power rail and a second power rail, wherein the clamp device is capable of conducting a first portion of an ESD current and the second transistor is capable of conducting a second portion of the ESD current as the conductive pad is relatively grounded.

Some examples of the present invention may provide a circuit capable of providing electrostatic discharge (ESD) protection that comprises a first transistor including a first gate and a first source, the first gate being connected to a conductive pad, an impedance device between the first source and a first power rail capable of providing a resistor, a second transistor including a second source, the second source being connected to the first power rail through the impedance device, a clamp device between the first power rail and a second power rail, and a third transistor capable of conducting a first portion of an ESD current through the clamp device as the conductive pad is relatively grounded, wherein the second transistor is capable of conducting a second portion of the ESD current between the conductive pad and the first power rail as the first portion of the ESD current flows through the clamp device.

Examples of the present invention may also provide a circuit capable of providing electrostatic discharge (ESD) protection that comprises a first transistor including a first gate and a first source, the first gate being connected to a conductive pad, an impedance device between the first source and a first power rail capable of providing a resistor, and a second transistor including a second source connected to the first power rail through the impedance device, the second transistor being capable of increasing a voltage level at the first source as the conductive pad is relatively grounded by conducting a portion of an ESD current between the conductive pad and the first power rail.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 5C is a layout diagram of a pumping transistor of the ESD protection circuit illustrated in FIG. 5A consistent with another example of the present invention;

DETAILED DESCRIPTION OF THE INVENTION

Reference will now be made in detail to the present examples of the invention, which are illustrated in the accompanying drawings. Wherever possible, the same reference numbers will be used throughout the drawings to refer to the same or like parts.

Figure 1:
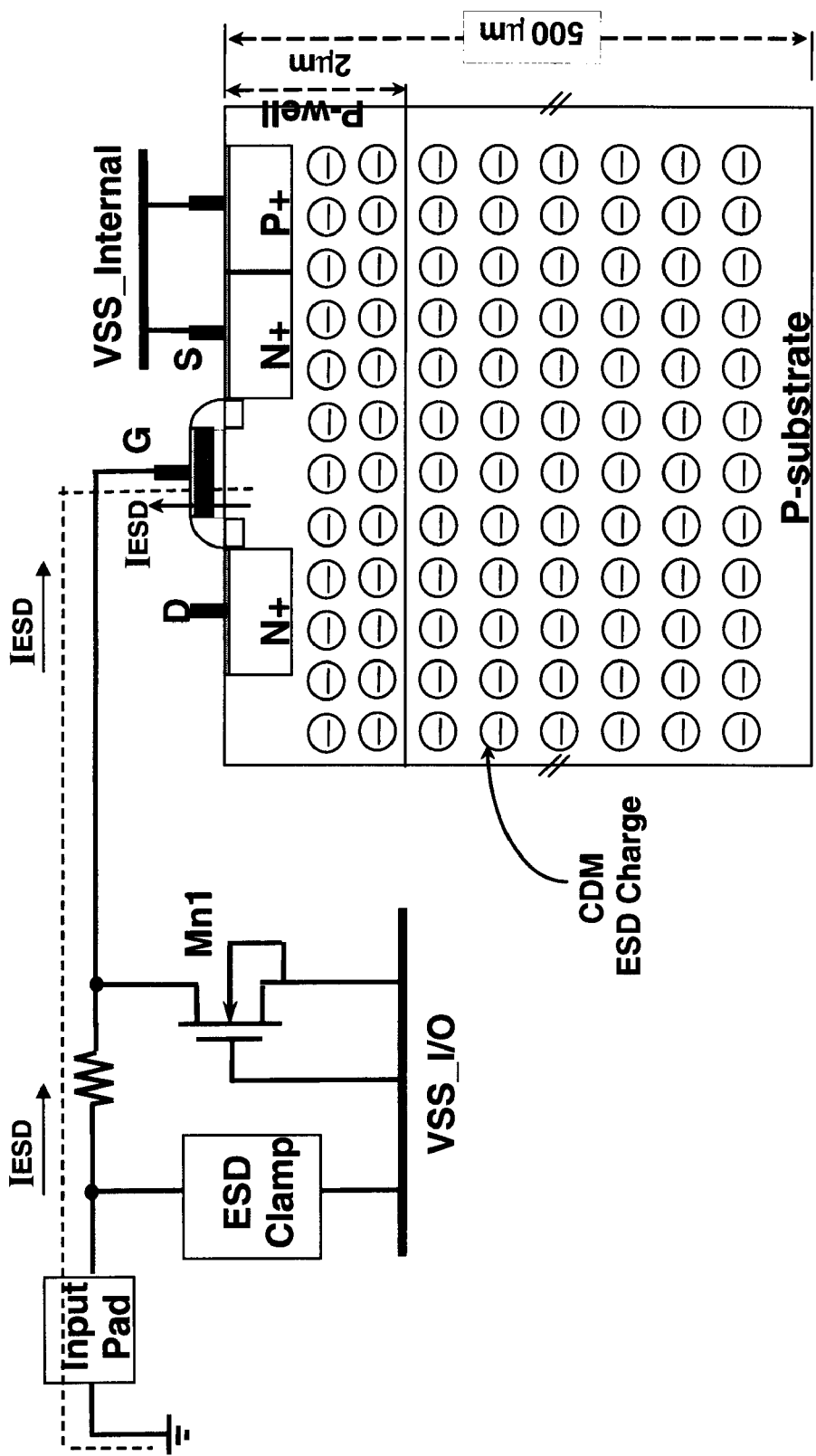
FIG. 1 is a schematic diagram illustrating a charged-device model ("CDM") phenomenon.
Figure 2:
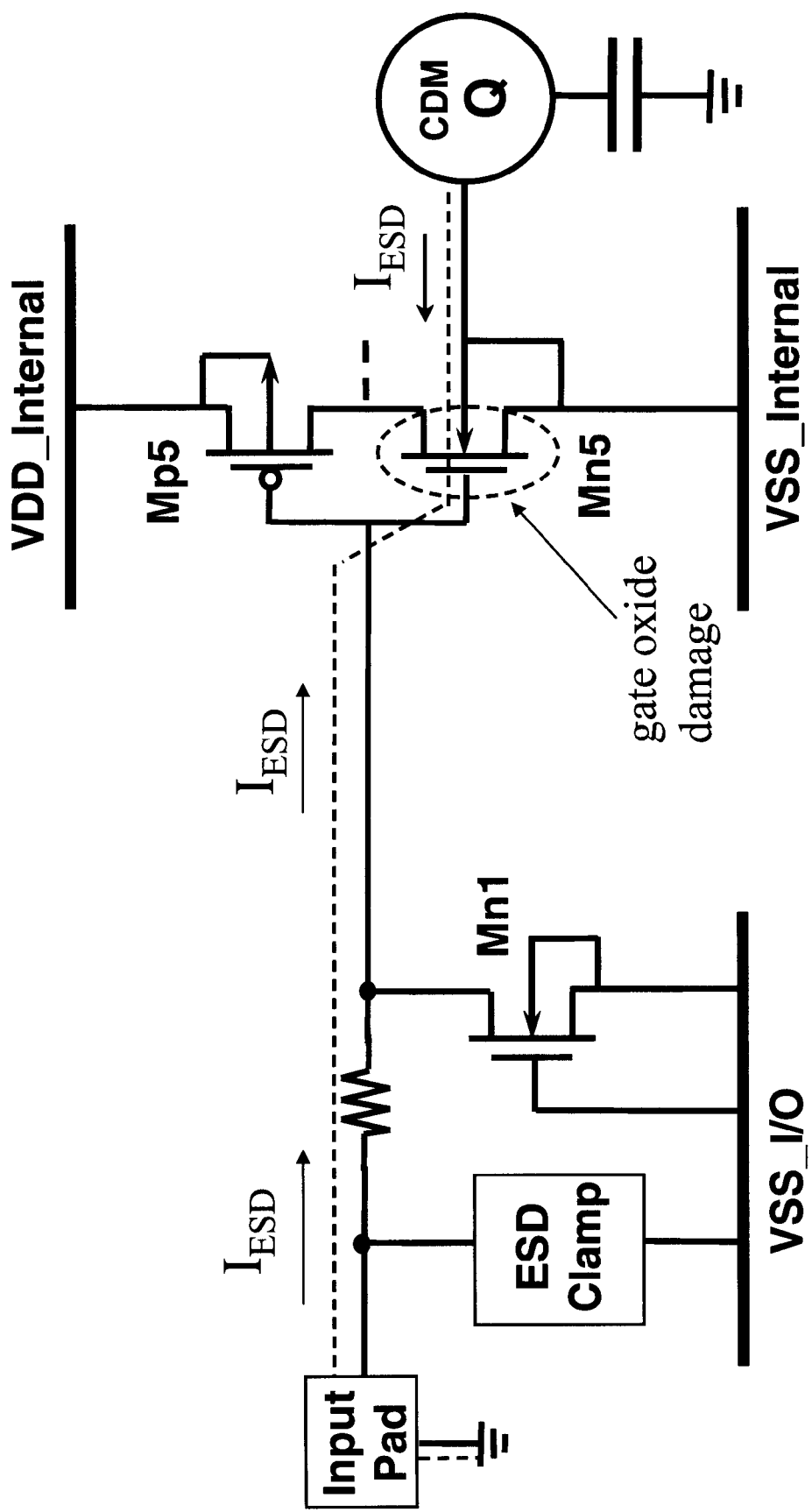
FIG. 2 is a schematic circuit diagram of a conventional electrostatic discharge ("ESD") protection circuit for an input-stage inverter.
Figure 3A:
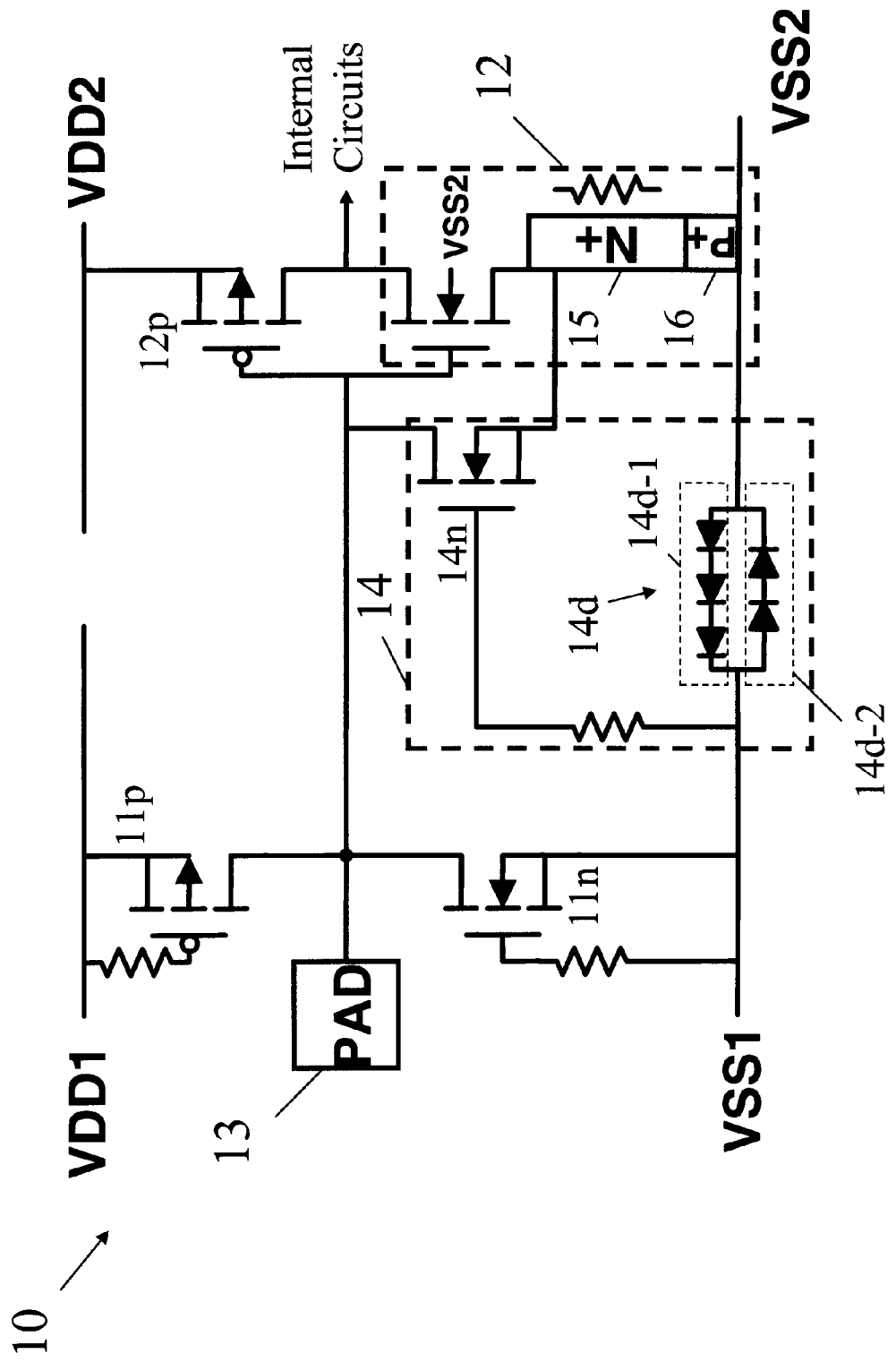
FIG. 3A is a circuit diagram of a circuit capable of ESD protection consistent with one example of the present invention.

FIG. 3A is a circuit diagram of a circuit 10 capable of ESD protection consistent with one example of the present invention. Referring to FIG. 3A, the circuit 10 may include an ESD clamp further comprising a PMOS transistor 11p and an NMOS transistor 11n, a self-biased current trigger ("SBCT") circuit 14 and a pumping NMOS transistor 12. The ESD clamp, disposed near a pad 13, may be capable of providing HBM and MM ESD protection for a CMOS inverter, which may comprise a PMOS transistor 12p and the NMOS transistor 12. The PMOS transistor 11p of the ESD clamp includes a gate, a source and a bulk, all of which (not numbered) are connected to a VDD1 line. Furthermore, the PMOS transistor 51p includes a drain (not numbered) connected to the pad 13. The NMOS transistor 1 in of the ESD clamp includes a gate, a source and a bulk, all of which (not numbered) are connected to a VSS1 line. Furthermore, the NMOS transistor 1 in includes a drain (not numbered) connected to the pad 13.

The PMOS transistor 12p of the inverter includes a source and a bulk, both of which (not numbered) are connected to a VDD2 line, a gate (not numbered) connected to the pad 13, and a drain (not numbered) connected to internal circuits. The NMOS transistor 12 of the inverter includes a source and a bulk, both of which are connected to a VSS2 line, a gate connected to the pad 13, and a drain connected to the internal circuits. Furthermore, the source of the NMOS transistor 12 is connected to the VSS2 line through a densely doped n-type (N+) diffused region 15, which functions to serve as a resistor, and a densely doped p-type (P+) diffused region 16, which serves as a pickup.

The SBCT circuit 14 may include an NMOS transistor 14n and a diode assembly 14d. The NMOS transistor 14n includes a source and a bulk, both of which (not numbered) are connected to the VSS2 line through the N+ region 15 and the P+ region 16, a gate (not numbered) connected to the VSS1 line through a resistor (not numbered), and a drain connected to the pad 13. The diode assembly 14d may include a first diode string 14d-1 and a second diode string 14d-2 connected in parallel to each other between the VSS1 and VSS2 lines.

Figure 3B:
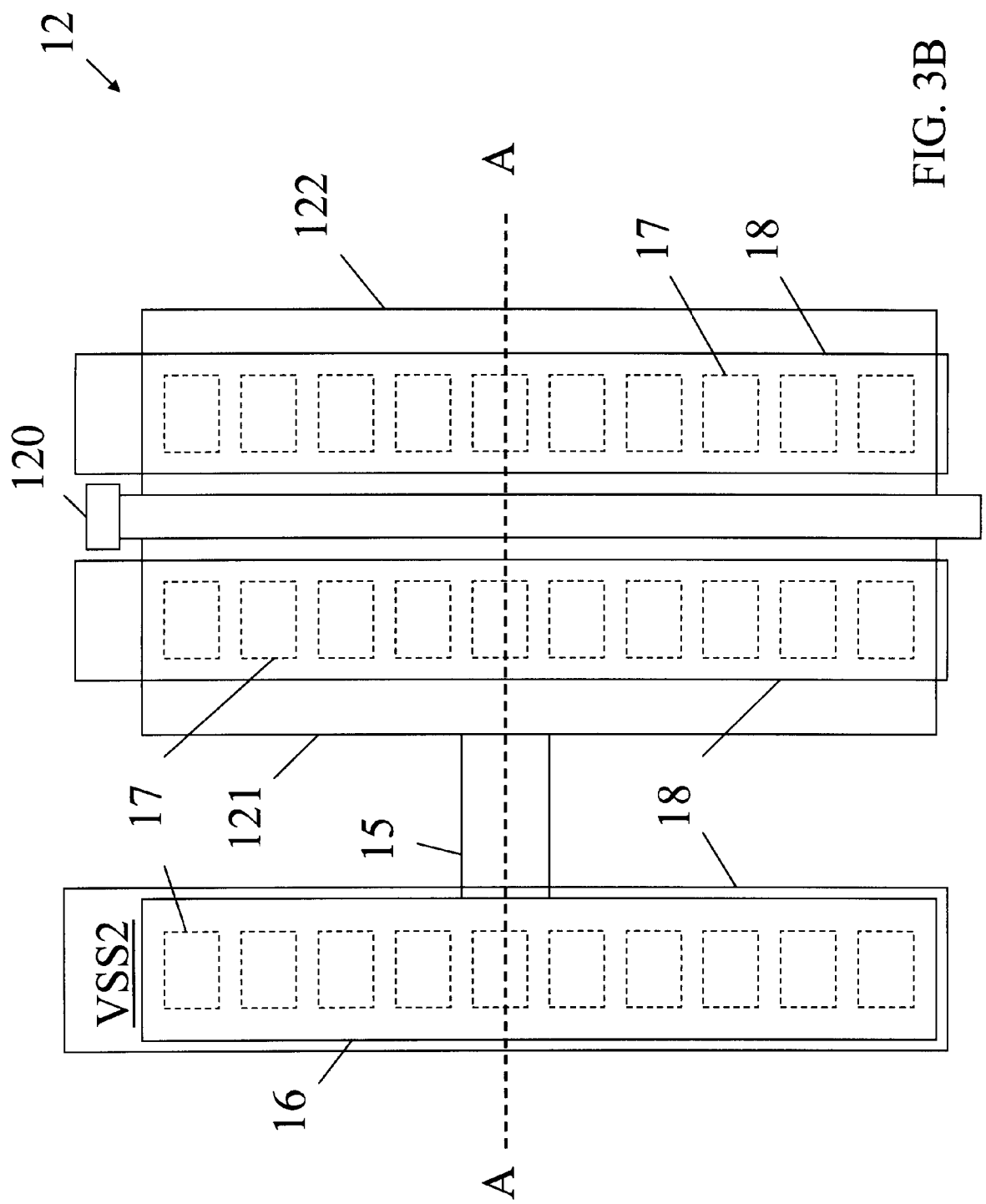
FIG. 3B is a layout diagram of a pumping transistor of the ESD protection circuit illustrated in FIG. 3A consistent with one example of the present invention.

FIG. 3B is a layout diagram of the pumping transistor 12 of the ESD protection circuit 10 illustrated in FIG. 3A consistent with one example of the present invention. Referring to FIG. 3B, the pumping transistor 12 includes a gate 120, an N+ source 121 and an N+ drain 122. The source 121 is connected to the P+ pickup 16 through the N+ resistor region 15. The resistance of the N+ resistor region 15 may be determined by the width and length of the N+ resistor region 15. A patterned metal layer 17 is formed over the source 121, the drain 122 and the pickup 16 to serve as contacts, which are electrically connected to another patterned metal layer 18 formed over the patterned metal layer 17.

Figure 3C:
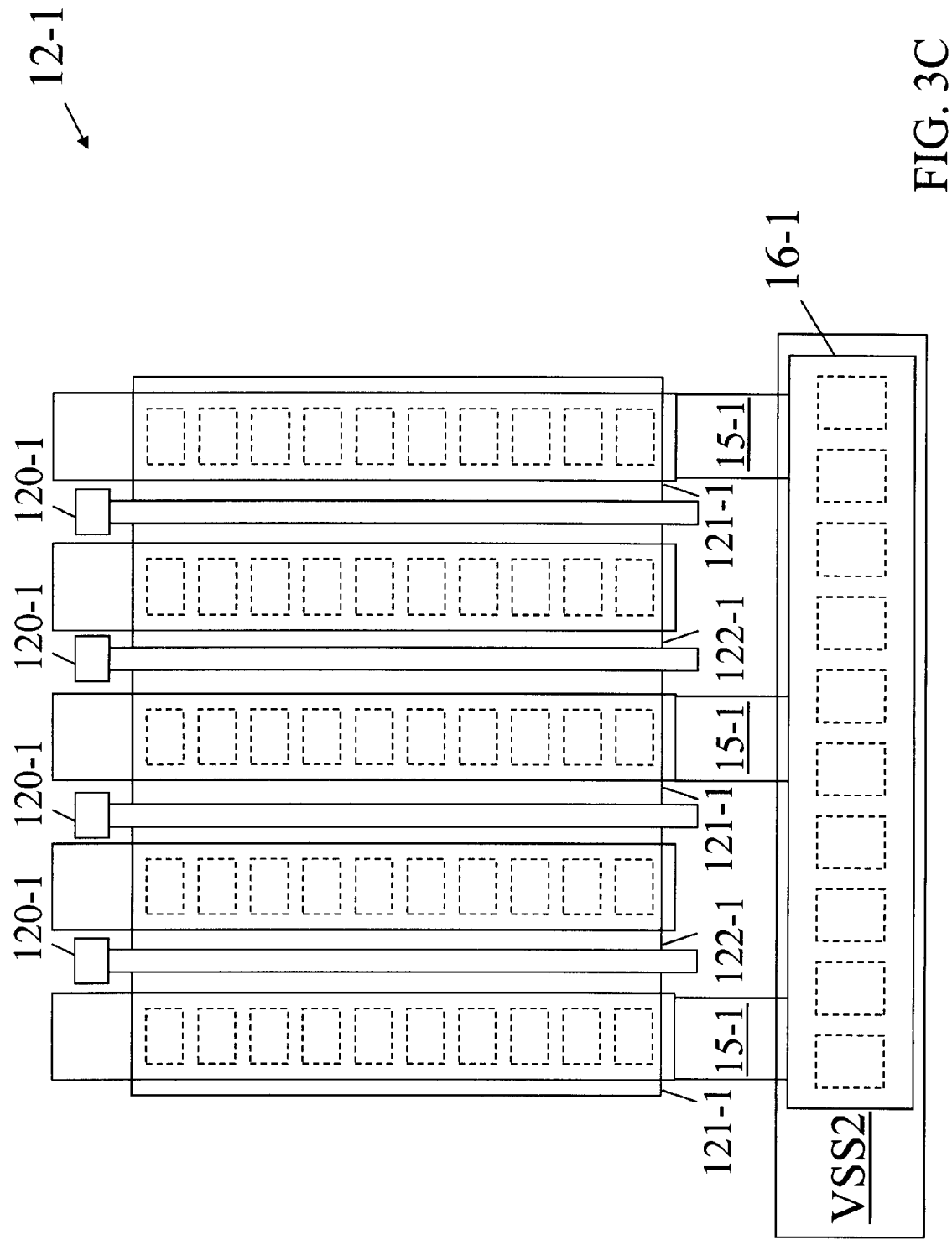
FIG. 3C is a layout diagram of a pumping transistor of the ESD protection circuit illustrated in FIG. 3A consistent with another example of the present invention.

FIG. 3C is a layout diagram of a pumping transistor 12-1 of the ESD protection circuit 10 illustrated in FIG. 3A consistent with another example of the present invention. Referring to FIG. 3C, the pumping transistor 12-1 includes a multi-finger structure further comprising a plurality of gates 120-1, sources 121-1 and drains 122-1. Each of the sources 121-1 is connected to a P+ pickup region 16-1 through an N+ resistor region 15-1.

Figure 3D:
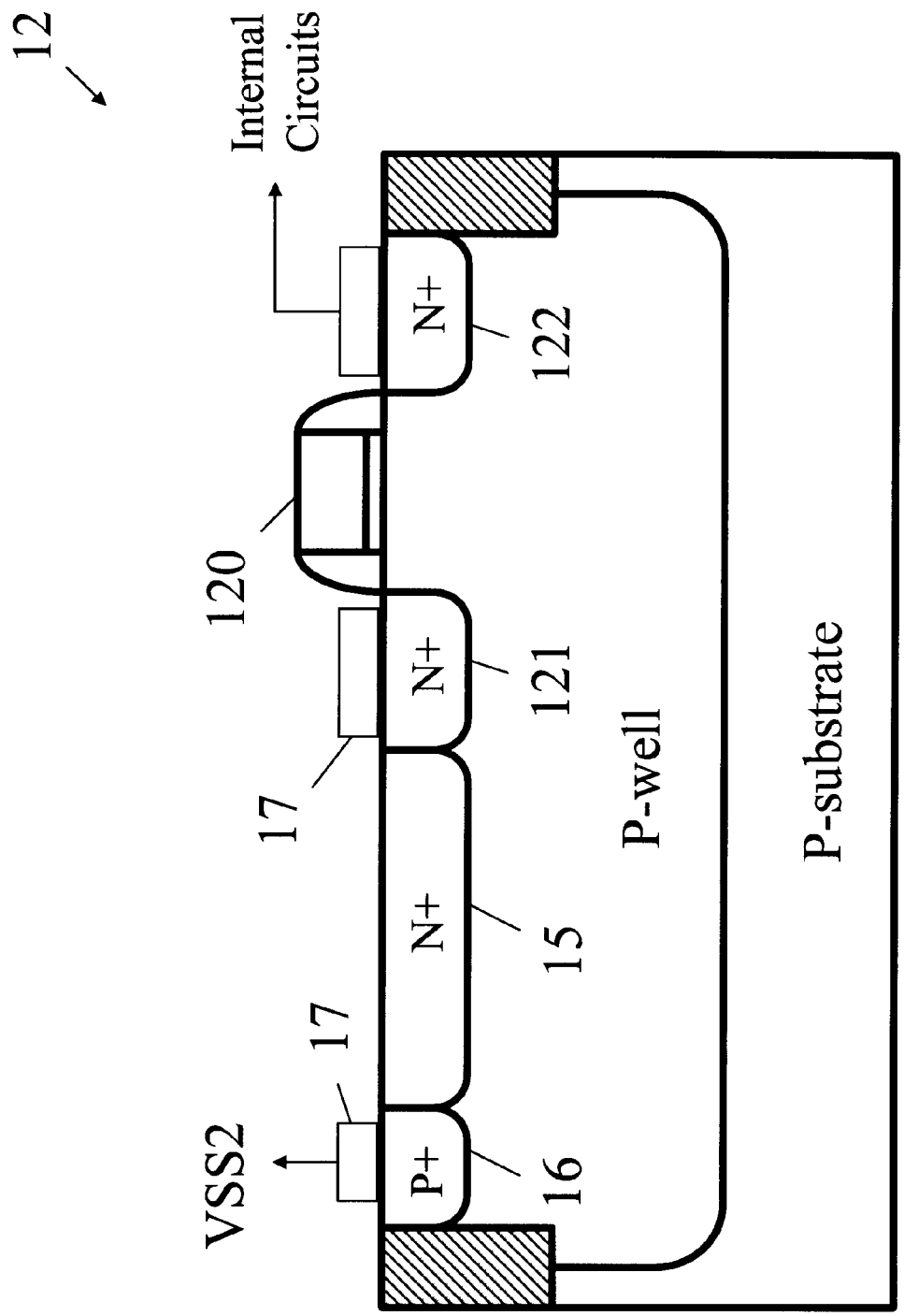
FIG. 3D is a cross-sectional view of the pumping transistor illustrated in FIG. 3B.

FIG. 3D is a cross-sectional view of the pumping transistor 12 illustrated in FIG. 3B along a line AA. Referring to FIG. 3D, the pumping transistor 12 includes the N+ regions 121 and 122 formed in a p-type well region (P-well), which in turn is formed in a p-type substrate (P-substrate). The N+ regions 121 and 122 serve as a source and a drain of the pumping NMOS transistor 12, respectively. Another N+ region 15 formed in the P-well serves as the resistor. The source 121 is connected to the P+ pickup 16 through the N+ region 15.

Figure 4A:
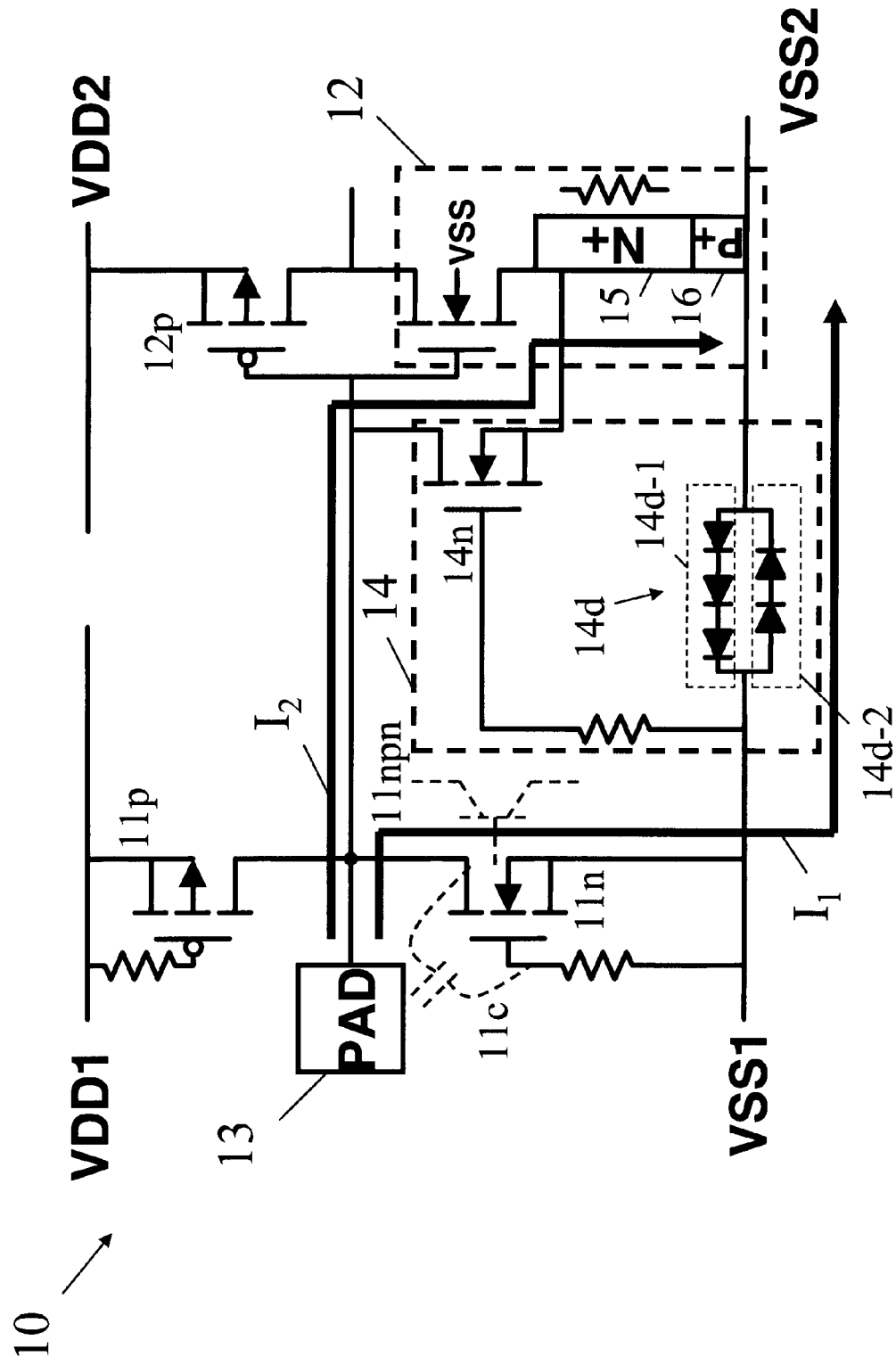
FIG. 4A is a schematic diagram illustrating an operation of the circuit illustrated in FIG. 3A consistent with one example of the present invention.

FIG. 4A is a schematic diagram illustrating an operation of the circuit 10 illustrated in FIG. 3A consistent with one example of the present invention. Referring to FIG. 4A, if the substrate is negatively charged and the pad 13 is relatively grounded, a negative CDM ESD stress occurs. A portion of the CDM ESD stress is rapidly coupled by a parasitic capacitor 11c (illustrated in dotted lines) formed by the gate and drain of the NMOS transistor 11n. The coupled voltage triggers a parasitic bipolar transistor 11npn (illustrated in dotted lines) formed by the drain, bulk and source of the NMOS transistor 11n. A first portion of the CDM ESD current, $I_1$, is discharged through the turn-on parasitic bipolar transistor 11npn and the second diode string 14d-2, which is forward biased. Note that the first current $I_1$ flows from the pad 13 to the substrate because the substrate is negatively charged.

The gate of the NMOS transistor 14n is biased by the first current $I_1$ flowing through the second diode string 14d-2. The NMOS transistor 14n is then turned on to conduct a second portion of the CDM ESD current, $I_2$, which may generally be smaller than the first portion $I_1$. The second current $I_2$ flows from the pad 13 to the substrate through the N+ region 15 and the P+ region 16, which pumps the source of the pumping transistor 12, increasing the source voltage level and in turn decreasing the gate-to-source voltage of the pumping transistor 12. The reduction in the gate-to-source voltage, as previously discussed, helps reduce the risk of gate oxide damage and therefore enhance the ESD robustness of the pumping transistor 12.

Figure 4B:
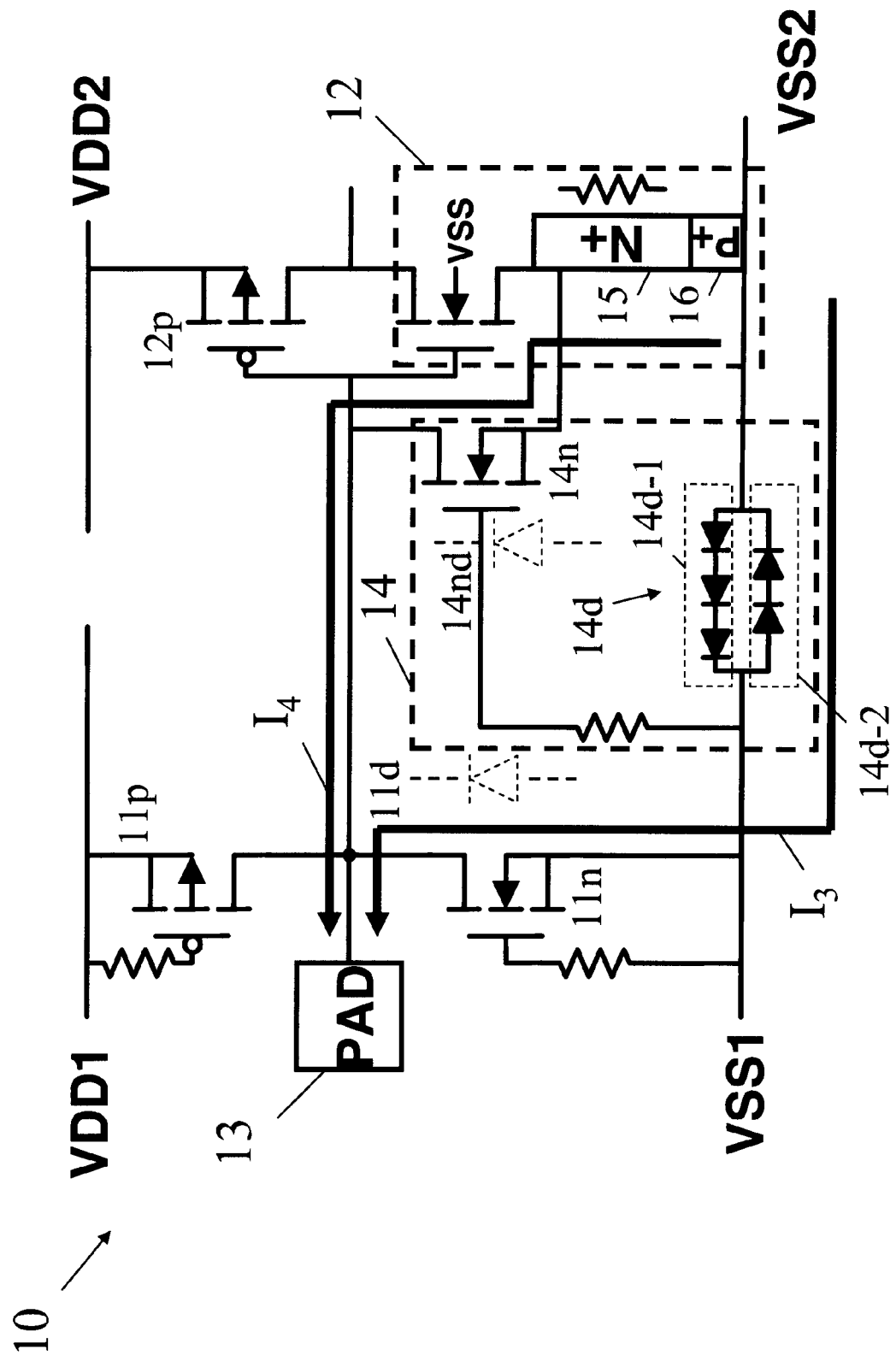
FIG. 4B is a schematic diagram illustrating an operation of the circuit illustrated in FIG. 3A consistent with another example of the present invention.

FIG. 4B is a schematic diagram illustrating an operation of the circuit 10 illustrated in FIG. 3A consistent with another example of the present invention. Referring to FIG. 4B, if the substrate is positively charged and the pad 13 is relatively grounded, a positive CDM ESD stress occurs. A first portion of the CDM ESD current, $I_3$, is discharged through the first diode string 14d-1 and a parasitic diode 11d (illustrated in dotted lines) formed by the bulk and drain of the NMOS transistor 11n. Note that the first current $I_3$ flows from the substrate to the pad 13 because the substrate is positively charged. A second portion of the CDM ESD current, $I_4$, is discharged through a parasitic diode 14nd formed by the bulk and drain of the NMOS transistor 14n (illustrated in dotted lines) to the pad 13. The second current $I_4$ pumps the source of the pumping transistor 12, increasing the source voltage level and in turn decreasing the gate-to-source voltage of the pumping transistor 12.

Figure 5A:
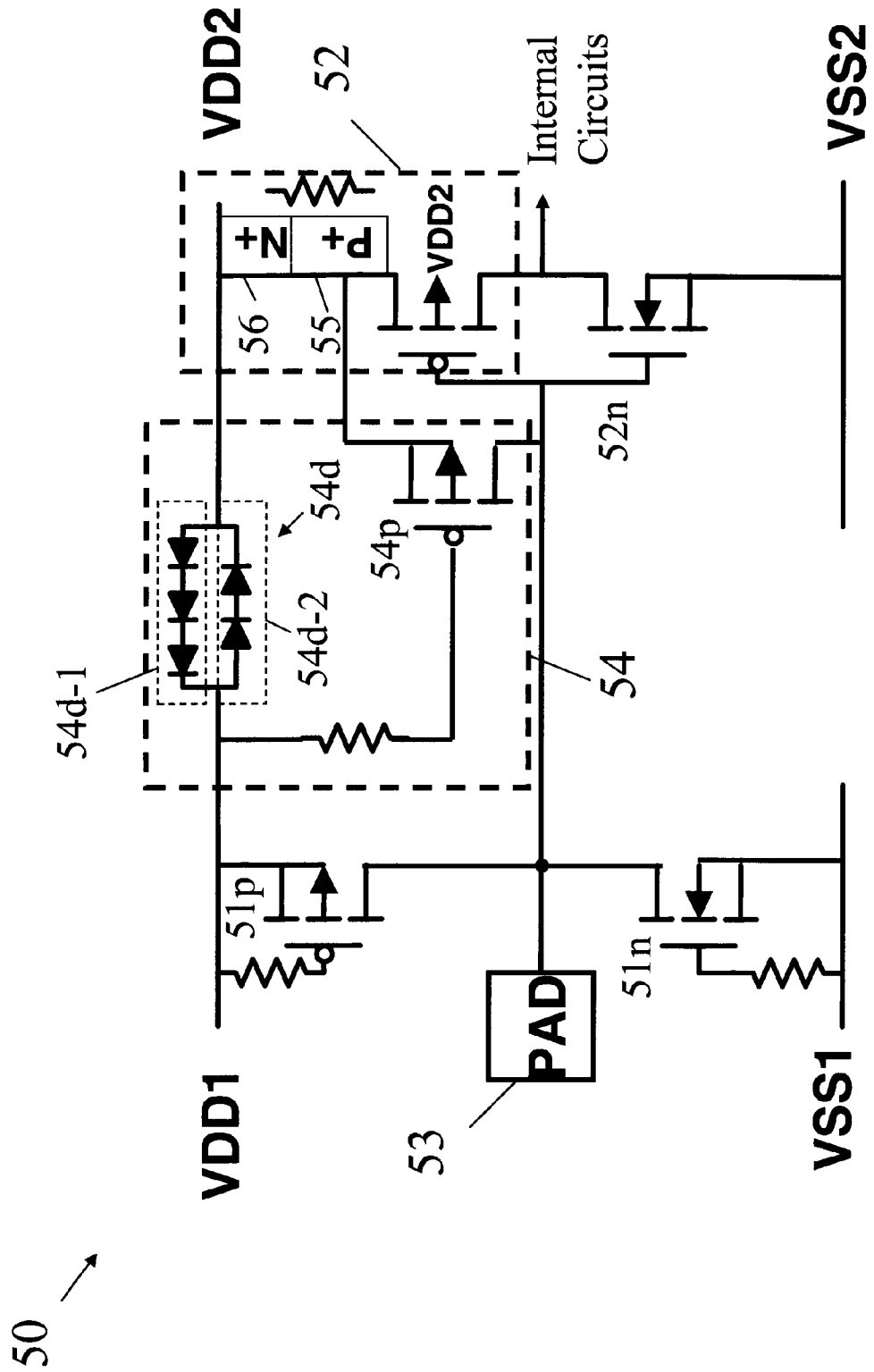
FIG. 5A is a circuit diagram of a circuit capable of ESD protection consistent with another example of the present invention.

FIG. 5A is a circuit diagram of a circuit 50 capable of ESD protection consistent with another example of the present invention. Referring to FIG. 5A, the circuit 50 may include an ESD clamp further comprising a PMOS transistor 51p and an NMOS transistor 51n, a self-biased current trigger ("SBCT") circuit 54 and a pumping PMOS transistor 52. The ESD clamp, disposed near a pad 53, may be capable of providing HBM and MM ESD protection for a CMOS inverter, which comprises the PMOS transistor 52 and an NMOS transistor 52n. The PMOS transistor 51p of the ESD clamp includes a gate, a source and a bulk, all of which (not numbered) are connected to a VDD1 line. Furthermore, the PMOS transistor 51p includes a drain (not numbered) connected to the pad 53. The NMOS transistor 51n of the ESD clamp includes a gate, a source and a bulk, all of which (not numbered) are connected to a VSS1 line. Furthermore, the NMOS transistor 51n includes a drain (not numbered) connected to the pad 53.

The NMOS transistor 52n of the inverter may include a source and a bulk, both of which (not numbered) are connected to a VSS2 line, a gate (not numbered) connected to the pad 53, and a drain (not numbered) connected to internal circuits. The PMOS transistor 52 of the inverter includes a source and a bulk, both of which are connected to a VDD2 line, a gate connected to the pad 53, and a drain connected to the internal circuits. Furthermore, the source of the PMOS transistor 52 is connected to the VDD2 line through a densely doped p-type (P+) diffused region 55, which functions to serve as a resistor, and a densely doped n-type (N+) diffused region 56, which serves as a pickup.

The SBCT circuit 54 may include a PMOS transistor 54p and a diode assembly 54d. The PMOS transistor 54p includes a source and a bulk, both of which (not numbered) are connected to the VDD2 line through the P+ region 55 and the N+ region 56, a gate (not numbered) connected to the VDD1 line, and a drain connected to the pad 53. The diode assembly 54d includes a first diode string 54d-1 and a second diode string 54d-2 connected in parallel to each other between the VDD1 and VDD2 lines.

Figure 5B:
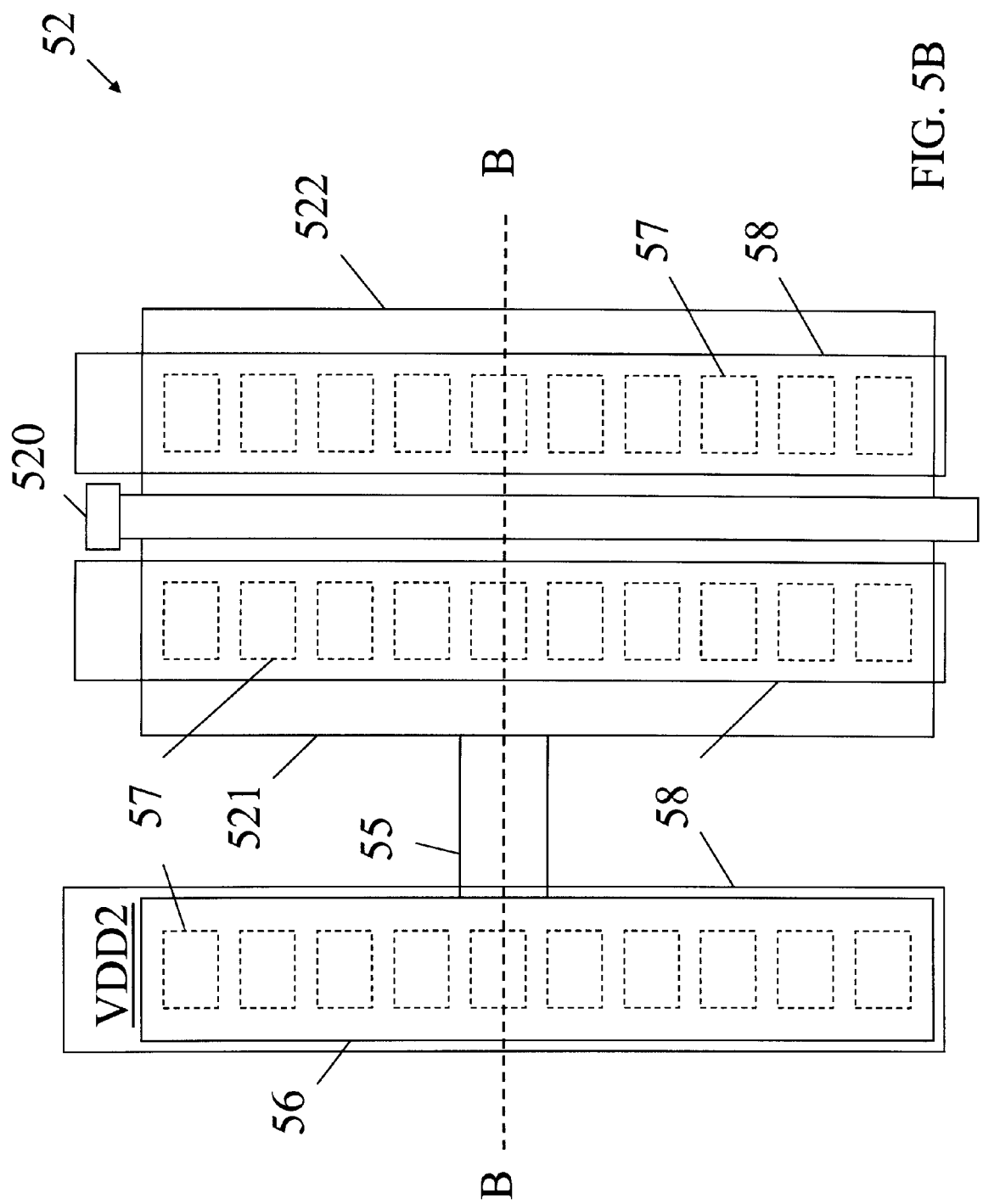
FIG. 5B is a layout diagram of a pumping transistor of the ESD protection circuit illustrated in FIG. 5A consistent with one example of the present invention.

FIG. 5B is a layout diagram of the pumping transistor 52 of the ESD protection circuit 50 illustrated in FIG. 5A consistent with one example of the present invention. Referring to FIG. 5B, the pumping transistor 52 includes a gate 520, a P+ source 521 and a P+ drain 522. The source 521 is connected to the N+ pickup 56 through the P+ resistor region 55. The resistance of the P+ resistor region 55 may be determined by the width and length of the P+ resistor region 55. A patterned metal layer 57 is formed over the source 521, the drain 522 and the pickup 56 to serve as contacts, which are electrically connected to another patterned metal layer 58 formed over the patterned metal layer 57.

FIG. 5C is a layout diagram of a pumping transistor 52-1 of the ESD protection circuit 50 illustrated in FIG. 5A consistent with another example of the present invention. Referring to FIG. 5C, the pumping transistor 52-1 includes a multi-finger structure further comprising a plurality of gates 520-1, sources 521-1 and drains 522-1. Each of the sources 521-1 is connected to an N+ pickup region 56-1 through a P+ resistor region 55-1.

Figure 5D:
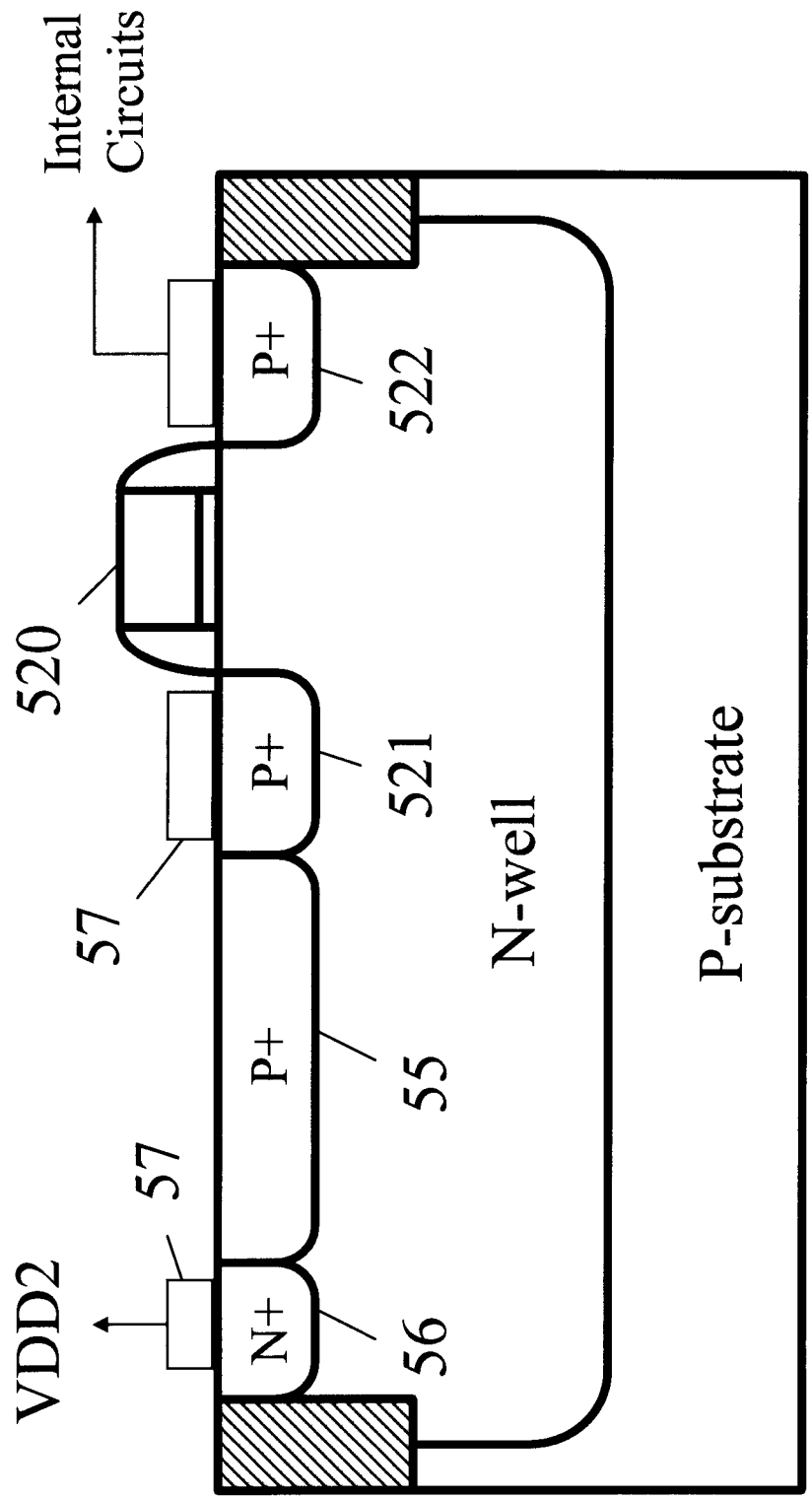
FIG. 5D is a cross-sectional view of the pumping transistor illustrated in FIG. 5B.

FIG. 5D is a cross-sectional view of the pumping transistor 52 illustrated in FIG. 5B along a line BB. Referring to FIG. 5D, the pumping transistor 52 includes the P+ regions 521 and 522 formed in an n-type well region (N-well), which in turn is formed in a p-type substrate (P-substrate). The P+ regions 521 and 522 serve as a source and a drain of the pumping NMOS transistor 52, respectively. Another P+ region 55 formed in the N-well serves as the resistor. The source 521 is connected to the N+ pickup 56 through the P+ region 55.

Figure 6A:
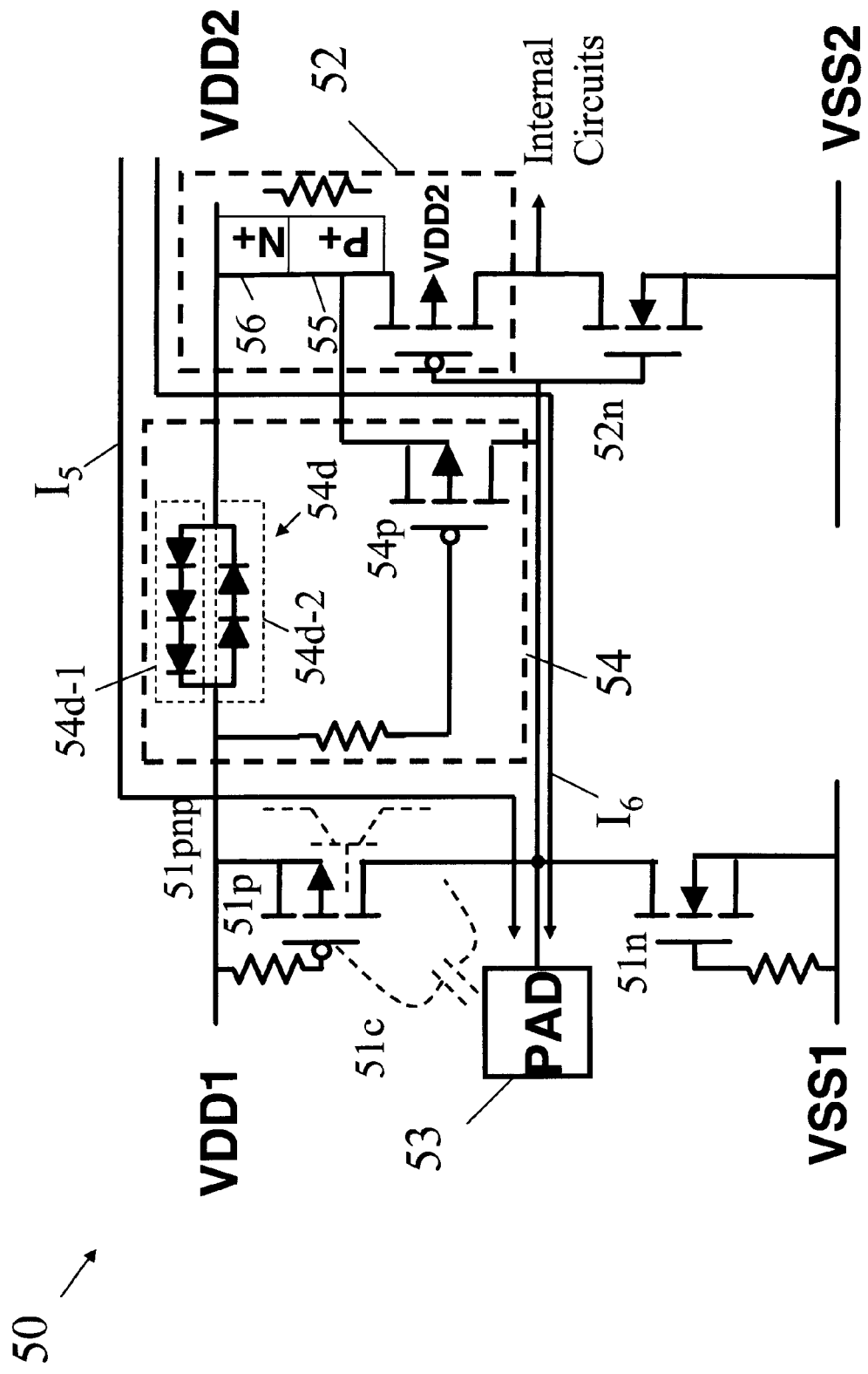
FIG. 6A is a schematic diagram illustrating an operation of the circuit illustrated in FIG. 5A consistent with one example of the present invention.

FIG. 6A is a schematic diagram illustrating an operation of the circuit illustrated 50 in FIG. 5A consistent with one example of the present invention. Referring to FIG. 6A, if the N-well (also referring to FIG. 5D) is positively charged and the pad 53 is relatively grounded, a positive CDM ESD stress occurs. A portion of the CDM ESD stress is rapidly coupled by a parasitic capacitor 51c (illustrated in dotted lines)

formed by the gate and drain of the PMOS transistor 51p. The coupled voltage triggers a parasitic bipolar transistor 51pnp (illustrated in dotted lines) formed by the drain, bulk and source of the PMOS transistor 51p. A first portion of the CDM ESD current, $I_5$, is discharged through the turn-on parasitic bipolar transistor 51pnp and the first diode string 54d-1 to the pad 53.

The gate of the PMOS transistor 54p is biased by the first current $I_5$ flowing through the first diode string 54d-1. The PMOS transistor 54p is then turned on to conduct a second portion of the CDM ESD current, $I_6$. The second current $I_6$ flows from the substrate to the pad 53 through the P+ region 55 and the N+ region 56, which pumps the source of the pumping transistor 52, increasing the source voltage level and in turn decreasing the gate-to-source voltage of the pumping transistor 52.

Figure 6B:
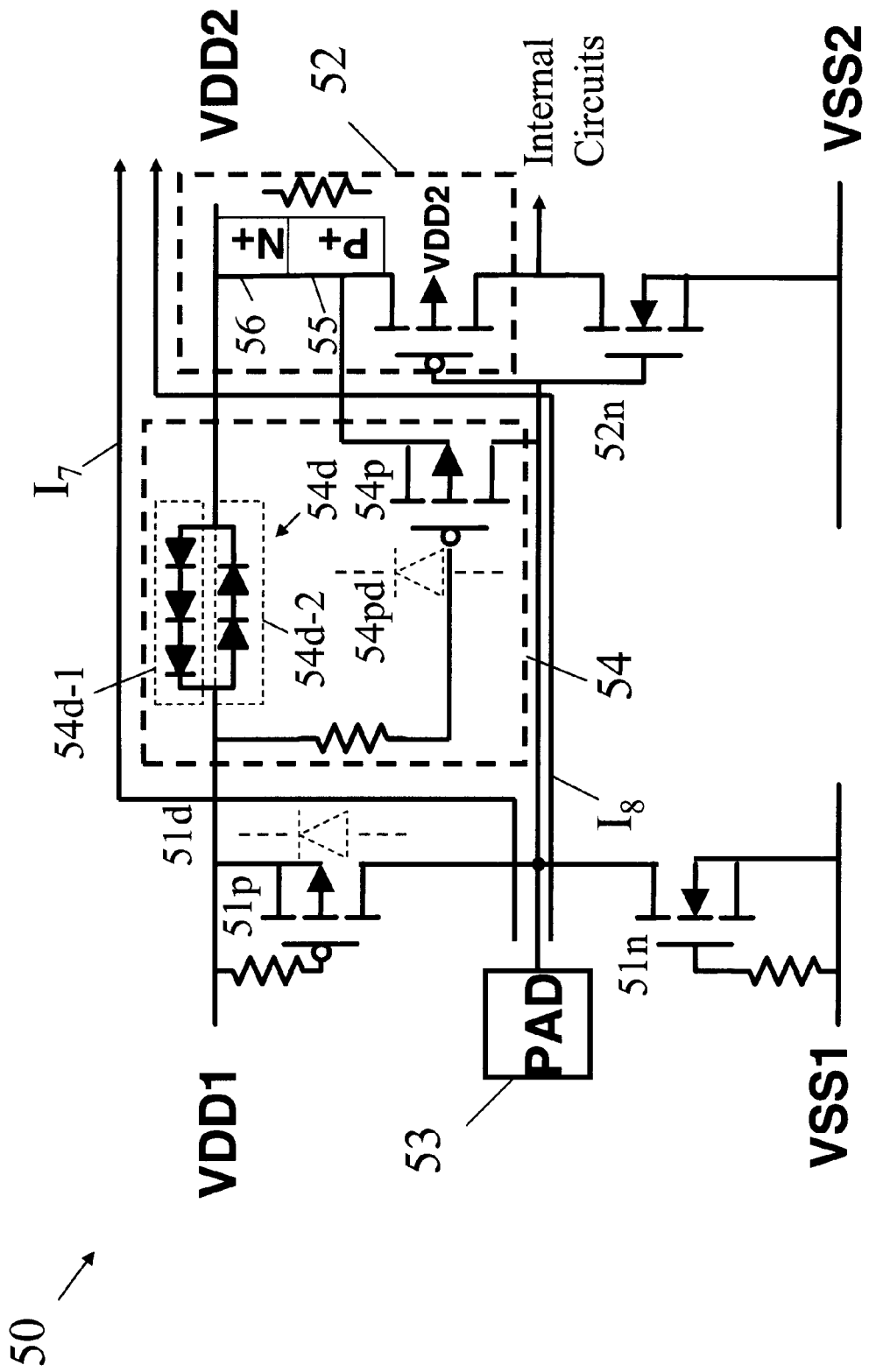
FIG. 6B is a schematic diagram illustrating an operation of the circuit illustrated in FIG. 5A consistent with another example of the present invention.

FIG. 6B is a schematic diagram illustrating an operation of the circuit 50 illustrated in FIG. 5A consistent with another example of the present invention. Referring to FIG. 6B, if the N-well is negatively charged and the pad 53 is relatively grounded, a negative CDM ESD stress occurs. A first portion of the CDM ESD current, $I_7$, is discharged through the second diode string 54d-2 and a parasitic diode 51d (illustrated in dotted lines) formed by the bulk and drain of the PMOS transistor 51p. A second portion of the CDM ESD current, $I_8$, is discharged through a parasitic diode 54pd (illustrated in dotted lines) formed by the bulk and drain of the PMOS transistor 54p. The second current $I_8$ flowing through the P+ region 55 and the N+ region 56 pumps the source of the pumping transistor 52, increasing the source voltage level and in turn decreasing the gate-to-source voltage of the pumping transistor 52.

Figure 7:
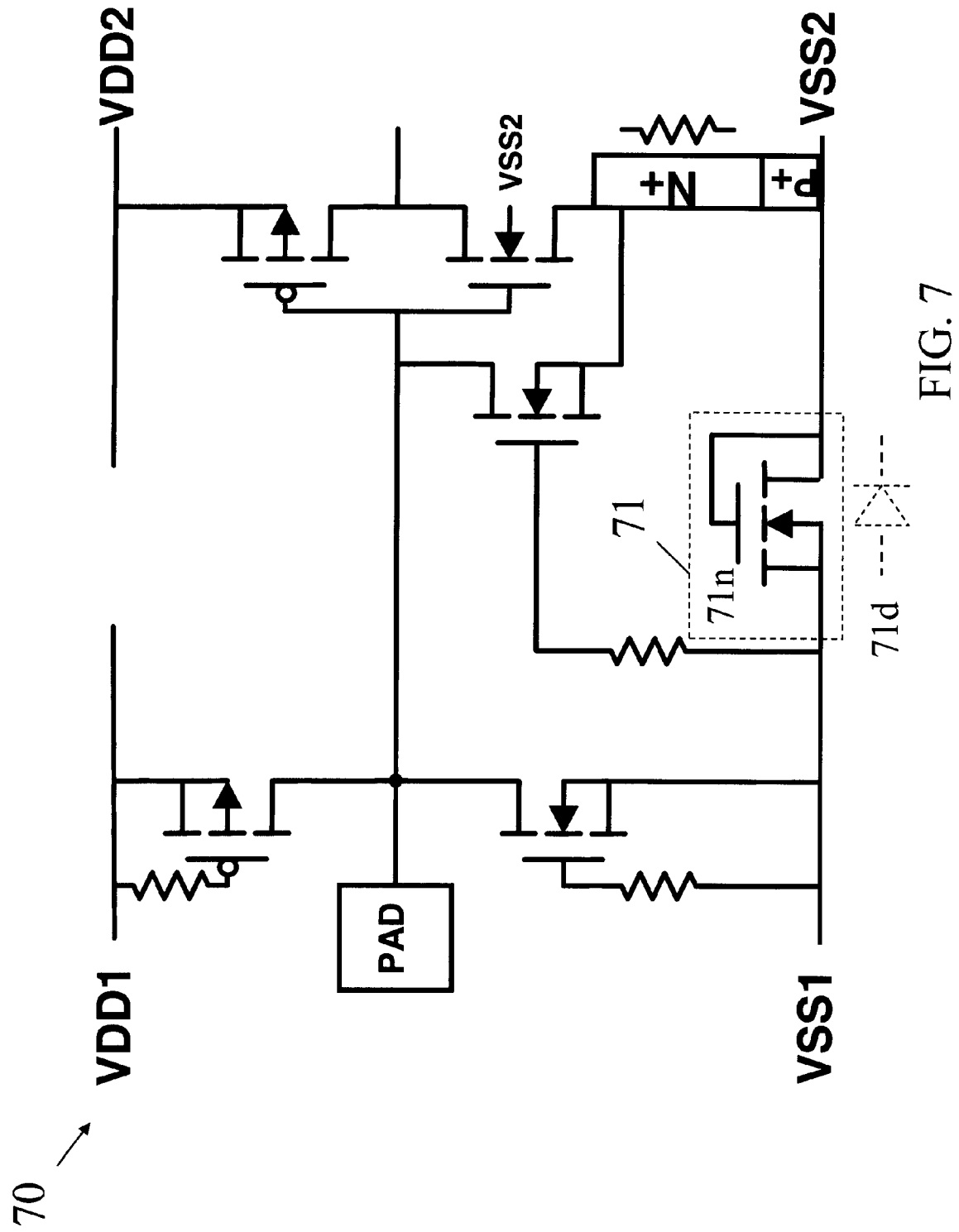
FIG. 7 is a circuit diagram of an ESD protection circuit consistent with still another example of the present invention.

FIG. 7 is a circuit diagram of an ESD protection circuit 70 consistent with still another example of the present invention. Referring to FIG. 7, the ESD protection circuit 70 is similar in structure to the circuit 10 illustrated in FIG. 3A, except an ESD clamp 71. Instead replaces the diode assembly 14d, the ESD clamp 71 includes an NMOS transistor 71n, which functions to provide a parasitic diode 71d (illustrated in dotted lines) in response to a CDM ESD stress.

Figure 8:
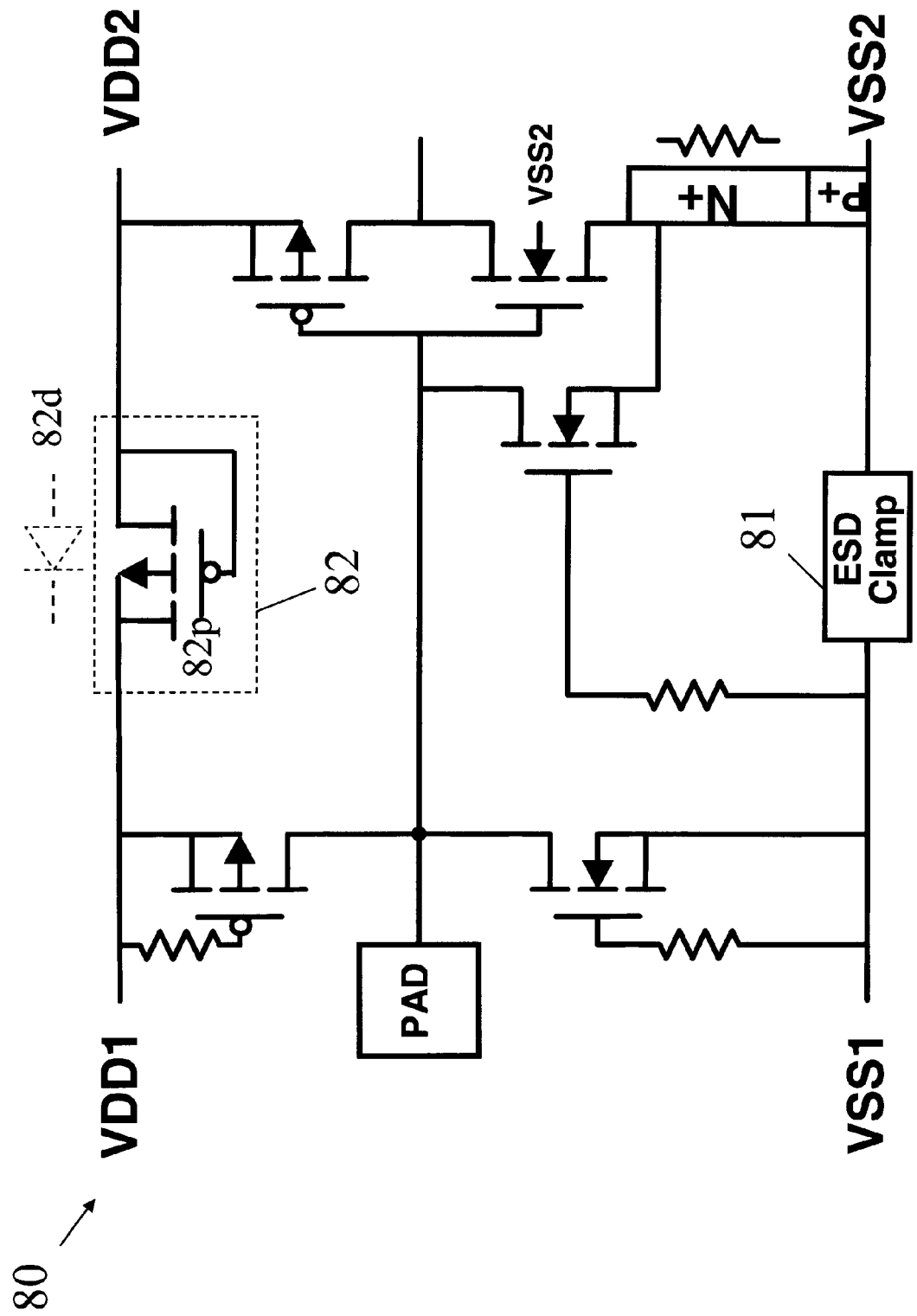
FIG. 8 is a circuit diagram of an ESD protection circuit consistent with yet another example of the present invention.

FIG. 8 is a circuit diagram of an ESD protection circuit 80 consistent with yet another example of the present invention. Referring to FIG. 8, the ESD protection circuit 80 is similar in structure to the circuit 70 illustrated in FIG. 7 except for ESD clamps 81 and 82. The ESD clamp 8 includes one of a diode assembly 14d as illustrated in FIG. 3A and an NMOS transistor 71 as illustrated in FIG. 7. Skilled persons in the art will understand that the ESD clamp 81 may be replaced by other ESD clamp that provides a parasitic diode. The ESD clamp 82 includes a PMOS transistor 82p, which functions to provide a parasitic diode 82d (illustrated in dotted lines) in response to a CDM ESD stress.

Figure 9:
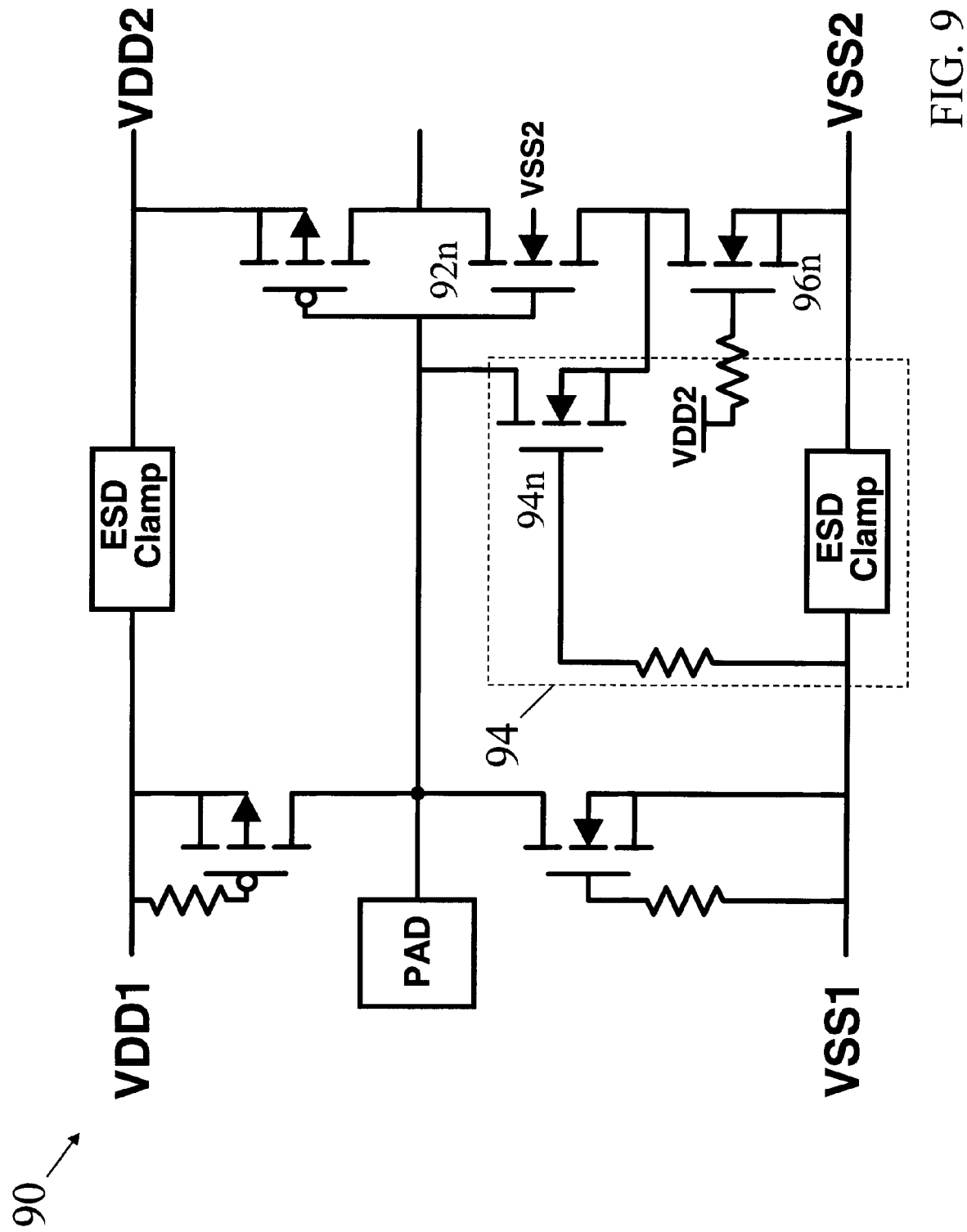
FIG. 9 is a circuit diagram of an ESD protection circuit consistent with yet still another example of the present invention.

FIG. 9 is a circuit diagram of an ESD protection circuit 90 consistent with yet still another example of the present invention. Referring to FIG. 9, the ESD protection circuit 90 is similar in structure to the ESD protection circuit 80 illustrated in FIG. 8 except that an NMOS transistor 96n replaces the N+ resistor region. An NMOS transistor 94n of an SBCT circuit 94 includes a source (not numbered) and a bulk (not numbered) connected to a drain (not numbered) of the NMOS transistor 96n. An NMOS transistor 92n includes a source (not numbered) connected to the drain of the NMOS transistor 96n. The NMOS transistor 96n further includes a gate (not numbered) connected to the VDD2 line, and a source (not numbered) and a bulk (not numbered) connected to the VSS2 line. The NMOS transistor 96n functions to serve as a resistor.

Figure 10:
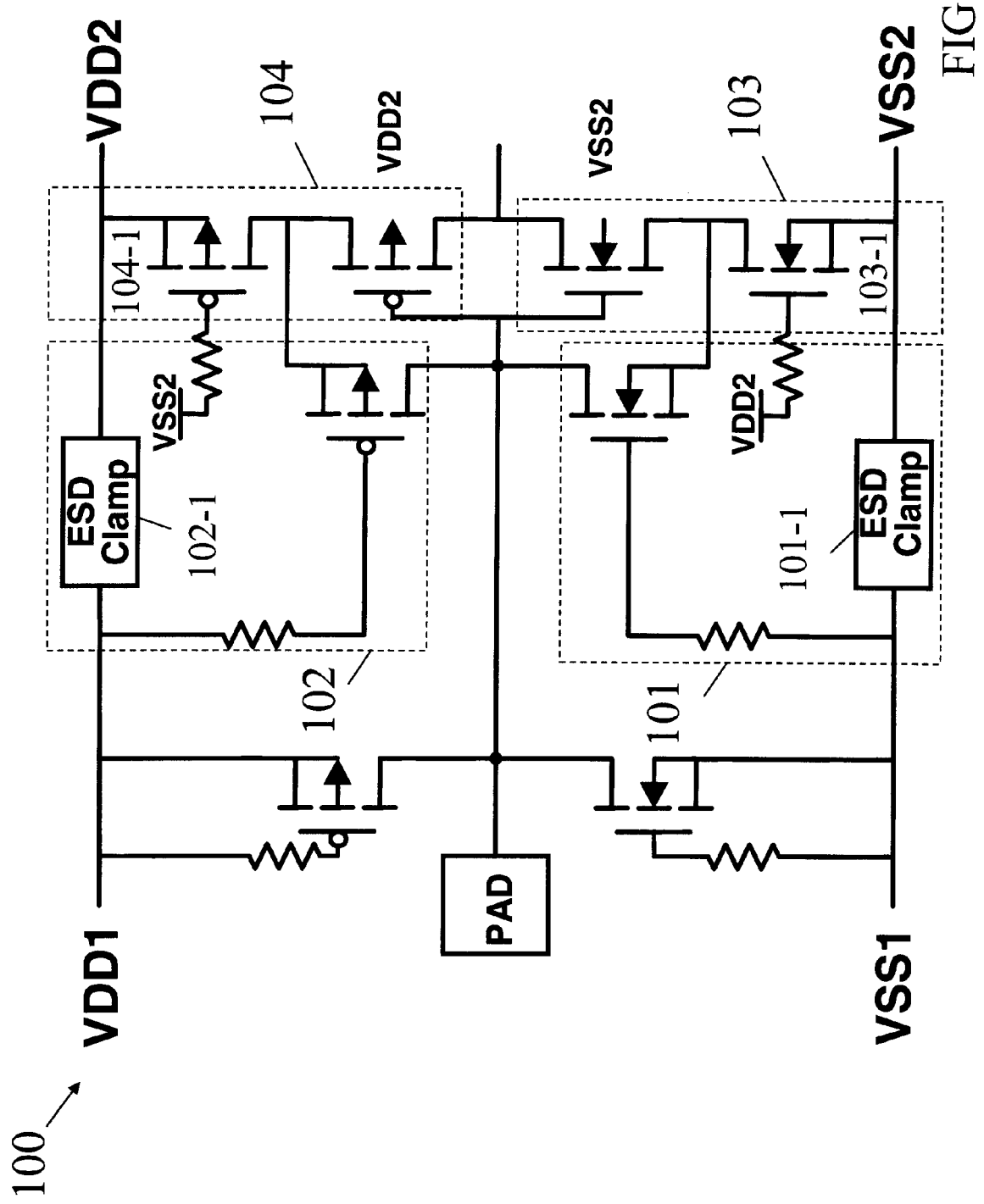
FIG. 10 is a circuit diagram of an ESD protection circuit consistent with an example of the present invention.

FIG. 10 is a circuit diagram of an ESD protection circuit 100 consistent with an example of the present invention. Referring to FIG. 10, the ESD protection circuit 100 includes a first SBCT circuit 101, a second SBCT circuit 102, a first pumping circuit 103 and a second pumping circuit 104. Each of ESD clamps 101-1 and 102-1 may be replaced by one of a diode assembly and an MOS transistor. An NMOS transistor 103-1 may be replaced by an N+ resistor region and a P+ pickup region. A PMOS transistor 104-1 may be replaced by a P+ resistor region and an N+ pickup region.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A circuit capable of providing electrostatic discharge (ESD) protection, comprising:
   a first transistor including a first gate and a first source, the first gate being connected to a conductive pad;
   an impedance device between the first source and a first power rail capable of providing a resistor;
   a second transistor including a second gate and a second source, the second source being connected to the first power rail through the impedance device; and
   a clamp device between the first power rail and a second power rail,
   wherein the clamp device is capable of conducting a first portion of an ESD current and the second transistor is capable of conducting a second portion of the ESD current as the conductive pad is relatively grounded.

2. The circuit of claim 1, wherein the impedance device includes a transistor.

3. The circuit of claim 1, wherein the impedance device includes a first diffused region of a first dopant type.

4. The circuit of claim 3, further comprising a second diffused region of a second dopant type between the first diffused region and the first power rail.

5. The circuit of claim 1, wherein the second gate is connected to the second power rail through a resistor.

6. The circuit of claim 1, wherein the clamp device includes one of at least one diode string and a transistor.

7. The circuit of claim 1, wherein the clamp device is capable of providing a parasitic diode during an ESD stress.

8. The circuit of claim 1, wherein the clamp device includes a first diode string and a second diode string connected in parallel to one another.

9. The circuit of claim 1, further comprising a third transistor, wherein the third transistor includes a first terminal connected to the conductive pad and a second terminal connected to the second power rail.

10. The circuit of claim 1, further comprising a third transistor, wherein the third transistor is capable of providing one of a parasitic diode and a parasitic bipolar transistor to conduct the first portion of the ESD current through the clamp device.

11. The circuit of claim 1, further comprising a third transistor, wherein the third transistor is capable of providing a first parasitic diode to conduct the first portion of the ESD current through the clamp device, and the second transistor is capable of providing a second parasitic diode to conduct the second portion of the ESD current.

12. The circuit of claim 1, further comprising:
 a third transistor including a third gate and a third source, the third gate being connected to the conductive pad; and
 an impedance device between the third source and a third power rail capable of providing a resistor.

13. The circuit of claim 12, further comprising:
 a fourth transistor including a fourth gate and a fourth source, the fourth source being connected to the third power rail through the impedance device between the third source and the third power rail; and
 a clamp device between the third power rail and a fourth power rail.

14. A circuit capable of providing electrostatic discharge (ESD) protection, comprising:
 a first transistor including a first gate and a first source, the first gate being connected to a conductive pad;
 an impedance device between the first source and a first power rail capable of providing a resistor;
 a second transistor including a second source, the second source being connected to the first power rail through the impedance device;
 a clamp device between the first power rail and a second power rail; and
 a third transistor capable of conducting a first portion of an ESD current through the clamp device as the conductive pad is relatively grounded,
 wherein the second transistor is capable of conducting a second portion of the ESD current between the conductive pad and the first power rail as the first portion of the ESD current flows through the clamp device.

15. The circuit of claim 14, wherein the impedance device includes a transistor.

16. The circuit of claim 14, wherein the impedance device includes a first diffused region of a first dopant type.

17. The circuit of claim 16, further comprising a second diffused region of a second dopant type between the first diffused region and the first power rail.

18. The circuit of claim 14, wherein the second transistor includes a second gate connected to the second power rail through a resistor.

19. The circuit of claim 14, wherein the clamp device includes one of at least one diode string and a transistor.

20. The circuit of claim 14, wherein the clamp device is capable of providing a parasitic diode during an ESD stress.

21. The circuit of claim 14, wherein the clamp device includes a first diode string and a second diode string connected in parallel to one another.

22. The circuit of claim 14, wherein the third transistor includes a first terminal connected to the conductive pad and a second terminal connected to the second power rail.

23. The circuit of claim 14, wherein the third transistor is capable of providing one of a parasitic diode and a parasitic bipolar transistor to conduct the first portion of the ESD current through the clamp device.

24. The circuit of claim 14, wherein the third transistor is capable of providing a first parasitic diode to conduct the first portion of the ESD current through the clamp device, and the second transistor is capable of providing a second parasitic diode to conduct the second portion of the ESD current.

25. A circuit capable of providing electrostatic discharge (ESD) protection, comprising:
 a first transistor including a first gate and a first source, the first gate being connected to a conductive pad;
 an impedance device between the first source and a first power rail capable of providing a resistor; and
 a second transistor including a second source connected to the first power rail through the impedance device, the second transistor being capable of increasing a voltage level at the first source as the conductive pad is relatively grounded by conducting a portion of an ESD current between the conductive pad and the first power rail.

26. The circuit of claim 25, further comprising a clamp device between the first power rail and a second power rail.

27. The device of claim 26, wherein the clamp device includes one of at least one diode string and a transistor.

28. The circuit of claim 25, wherein the impedance device includes a first diffused region of a first dopant type.

29. The circuit of claim 28, further comprising a second diffused region of a second dopant type between the first diffused region and the first power rail.

30. The circuit of claim 25, further comprising a third transistor, wherein the third transistor is capable of providing one of a parasitic diode and a parasitic bipolar transistor to conduct a portion of the ESD current.

31. The circuit of claim 25, further comprising a third transistor, wherein the third transistor is capable of providing a first parasitic diode to conduct a first portion of the ESD current, and the second transistor is capable of providing a second parasitic diode to conduct a second portion of the ESD current.

\* \* \* \* \*